(12) United States Patent
Zhu et al.

(10) Patent No.: US 8,854,105 B2
(45) Date of Patent: Oct. 7, 2014

(54) SIGNAL RECEIVER AND SIGNAL TRANSMISSION APPARATUS

(71) Applicant: Semiconductor Manufacturing International (Shanghai) Corporation, Shanghai (CN)

(72) Inventors: Kaven Zhu, Shanghai (CN); Jason Chen, Shanghai (CN); Allen Mo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 13/855,466

(22) Filed: Apr. 2, 2013

(65) Prior Publication Data

US 2014/0176222 A1     Jun. 26, 2014

(30) Foreign Application Priority Data

Dec. 25, 2012  (CN) .......................... 2012 1 0572447

(51) Int. Cl.
*H03L 5/00*         (2006.01)
*H03K 19/0185*      (2006.01)

(52) U.S. Cl.
CPC .............................. *H03K 19/018521* (2013.01)
USPC ............................................ 327/333; 326/62

(58) Field of Classification Search
USPC ............................................ 327/333; 326/62
See application file for complete search history.

(56) References Cited

U.S. PATENT DOCUMENTS

| | | | |
|---|---|---|---|
| 7,649,381 B2 * | 1/2010 | Yamashita et al. | 326/68 |
| 8,536,905 B2 * | 9/2013 | Uchino et al. | 327/108 |
| 8,618,842 B2 * | 12/2013 | Kwon | 327/108 |
| 2002/0048188 A1 * | 4/2002 | Huber | 365/185.05 |
| 2002/0196068 A1 * | 12/2002 | Taheri | 327/333 |
| 2004/0156258 A1 * | 8/2004 | Huber | 365/230.05 |
| 2005/0270080 A1 * | 12/2005 | Kida et al. | 327/333 |
| 2006/0220590 A1 * | 10/2006 | Tanabe et al. | 315/209 R |
| 2007/0063759 A1 * | 3/2007 | Kida et al. | 327/333 |
| 2008/0157816 A1 * | 7/2008 | Yamashita et al. | 326/68 |
| 2009/0018787 A1 * | 1/2009 | Chuang et al. | 702/71 |
| 2009/0066422 A1 * | 3/2009 | Bartlett | 330/296 |
| 2009/0225206 A1 * | 9/2009 | Oike et al. | 348/294 |
| 2009/0237124 A1 * | 9/2009 | Nakajima | 327/108 |
| 2012/0223760 A1 * | 9/2012 | Uchino et al. | 327/333 |
| 2013/0082769 A1 * | 4/2013 | Kwon | 327/581 |

* cited by examiner

*Primary Examiner* — Adam Houston
(74) *Attorney, Agent, or Firm* — Kilpatrick Townsend & Stockton LLP (57) ABSTRACT

A signal receiver includes first and second bias circuits that receive an input signal and convert the input signal to respective first and second bias signals. The signal receiver also includes a first inverter comprising a PMOS device and an NMOS device, each device has a source, a drain, and a gate. When the voltage magnitude of the first bias signal is smaller than that of the input signal, the gate of the PMOS device is coupled to the first bias signal and the gate of the NMOS device is coupled to the input signal. When the voltage magnitude of the first bias signal is greater than that of the input signal, the gate of the NMOS device is coupled to the first bias signal and the gate of the PMOS device is coupled to the input signal.

9 Claims, 6 Drawing Sheets

SIGNAL RECEIVER AND SIGNAL TRANSMISSION APPARATUS

CROSS-REFERENCES TO RELATED APPLICATIONS

This application claims the benefit of and priority to Chinese Patent Application No. CN201210572447.7, filed on Dec. 25, 2012, which is commonly owned and incorporated by reference herein for all purpose in its entirety.

FIELD OF THE INVENTION

The application relates to integrated circuit devices, and more particularly to a signal receiver and signal transmission apparatus.

BACKGROUND OF THE INVENTION

Figure 1:
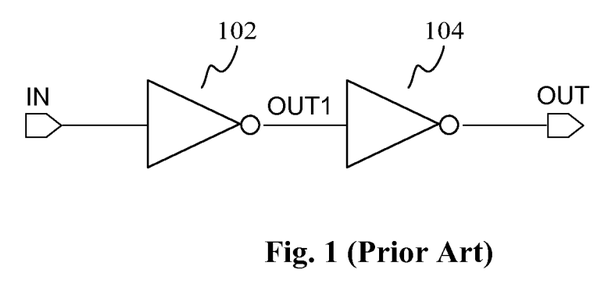
FIG. 1 is a schematic diagram of a digital signal receiver according to relevant technologies.
Figure 2:
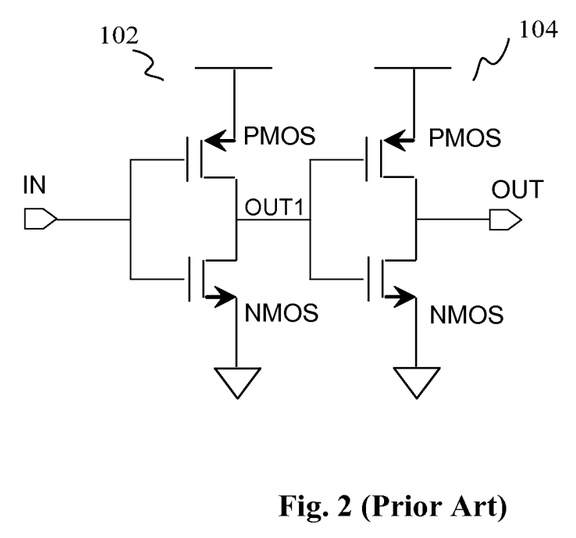
FIG. 2 is an illustrative diagram of the digital signal receiver according to relevant technologies.

Integrated circuit I/O interface is widely used for transmission of signals between chips. An I/O interface can be realized by a digital signal receiver, and the simplest digital signal receiver can include a pair of inverters 102 and 104 connected in series, as shown in FIG. 1. Further, as shown in FIG. 2, the inverters 102 and 104 in FIG. 1 can be CMOS inverters, each comprising a pair of NMOS and PMOS devices connected in series between a power supply voltage and a ground. When the input signal IN is a high logic level ("high"), the NMOS device in the inverter 102 is turned on, such that the output OUT1 of the inverter 102 is a low logic level ("low"), then the PMOS device in the inverter 104 is turned on, such that the output OUT of the inverter 104 is high. Similarly, when the input signal IN is low, the PMOS device in the inverter 102 is turned on, such that the output OUT1 of the inverter 102 is high, then the NMOS device in the inverter 104 is turned on, such that the output OUT of the inverter 104 is low.

When the amplitude of the input voltage is rail to rail (meaning the input voltage of the device can go as high as the power supply voltage and as low as the ground), the gain of the PMOS device is the same as that of the NMOS device, making the output slew rate of the inverter substantially balanced.

However, when the amplitude of the input voltage is not rail to rail (e.g., small input signal having a voltage swing within the power and ground), one of these two PMOS and NMOS devices works under a smaller overdrive voltage than the other, such that the output of the inverter is associated with the stronger one of the PMOS and NMOS devices. In other words, the signal swing at the inverter output is rather asymmetrical and does not have balanced rise and fall times. In this case, the higher the frequency of the input signal is, the poorer the speed performance of the digital signal receiver is.

Therefore, there is a need to provide a receiver circuit that has high gain and improved speed performance.

BRIEF SUMMARY OF THE INVENTION

Embodiments of the present invention provide a signal receiver, a signal input apparatus, a signal output apparatus and a signal transmission apparatus that have improved interface with signals having non-rail-to-rail voltage swings for both high-to-low and low-to-high transitions.

An embodiment of the present invention provides a signal receiver comprising a first bias circuit, a first inverter coupled to the first bias circuit, and a second inverter coupled to the first inverter. The first bias circuit is coupled to an input of the signal receiver and configured to convert an input signal to a first bias signal, wherein the first bias signal has a voltage amplitude different from a voltage amplitude of the input signal. The first inverter includes a PMOS device and an NMOS device connected in series between a power supply voltage and a ground. The second inverter is coupled to the first inverter and configured to output an output signal that is an amplified version of the input signal.

In one embodiment, in the case where the voltage amplitude of the first bias signal is smaller than the voltage amplitude of the input signal of the signal receiver, a gate of the PMOS device of the first inverter is in connection with the output of the first bias circuit, and a gate of the NMOS device of the first inverter is in connection with the input of the signal receiver; and in the case where the voltage amplitude of the first bias signal is greater than the voltage amplitude of the input signal of the signal receiver, the gate of the NMOS device of the first inverter is in connection with the output of the first bias circuit, and the gate of the PMOS device in the first inverter is in connection with the input of the signal receiver.

In one embodiment, the signal receiver further comprises a second bias circuit having an input in connection with the input of the signal receiver for converting the input signal of the signal receiver to a second bias signal. The second bias signal has a voltage amplitude different from the voltage amplitude of the input signal of the signal receiver. In the case where the voltage amplitude of the first bias signal is smaller than the voltage amplitude of the input signal of the signal receiver, and the voltage amplitude of the second bias signal is greater than the voltage amplitude of the input signal of the signal receiver, the gate of the PMOS device of the first inverter is in connection with the output of the first bias circuit, and the gate of the NMOS device of the first inverter is in connection with an output of the second bias circuit for receiving the second bias signal of the second bias circuit. In the case where the voltage amplitude of the first bias signal is greater than the voltage amplitude of the input signal of the signal receiver, and the voltage amplitude of the second bias signal is smaller than the voltage amplitude of the signal inputted from the input end of the signal receiver, the gate of the NMOS device of the first inverter is in connection with the output of the first bias circuit, and the gate of the PMOS device of the first inverter is in connection with the output of the second bias circuit, for receiving the second bias signal of the second bias circuit.

In one embodiment, in the case where the voltage amplitude of the first bias signal is smaller than the voltage amplitude of the input signal of the signal receiver, the first bias circuit comprises a first voltage division circuit connected between the input of the first bias circuit and the ground; and in the case where the voltage amplitude of the first bias signal is greater than that of the input signal of the signal receiver, the first bias circuit comprises: a second voltage division circuit disposed between the input of the first bias circuit and a predetermined power supply voltage, wherein an amplitude of the predetermined power supply voltage is greater than the voltage amplitude of the input signal of the signal receiver.

In one embodiment, in the case where the voltage amplitude of the second bias signal is smaller than that of the input signal of the signal receiver, the second bias circuit comprises a first voltage division circuit connected between the input of the second bias circuit and the ground; and in the case where the voltage amplitude of the second bias signal is greater than that of the input signal of the signal receiver, the second bias circuit comprises: a second voltage division circuit disposed between the input end of the second bias circuit and a predetermined power voltage, wherein an amplitude of the predetermined power voltage is greater than the voltage amplitude of the input signal of the signal receiver.

In one embodiment, the first voltage division circuit comprises a first resistor and a second resistor connected in series between the input of the signal receiver and the ground, wherein a terminal of the first resistor is connected to a terminal of the second resistor to form a node that is the output of the first bias circuit or the output of the second bias circuit. In another embodiment, the first voltage division circuit comprises a first transistor and a second transistor connected in series between the input of the signal receiver and the ground, wherein a terminal of the first transistor is connected to a terminal of the second transistor to form a node that is the output of the first bias circuit or the output of the second bias circuit.

In one embodiment, the second voltage division circuit comprises a third resistor and a fourth resistor connected in series between the input of the signal receiver and the predetermined power supply voltage, wherein a terminal of the third resistor is connected to a terminal of the fourth resistor to form a node that is the output of the second bias circuit or the output of the first bias circuit. In another embodiment, the second voltage division circuit comprises a third transistor and a fourth transistor connected in series between the input of the signal receiver and the predetermined power supply voltage, wherein a terminal of the third transistor is connected to a terminal of the fourth transistor to form a node that is the output of the second bias circuit or the output of the first bias circuit.

An embodiment of the present invention also provides a signal input apparatus comprising: a first transmission device, a signal receiver, and a first processor that are sequentially connected. The first transmission device is configured to transmit a signal to the signal receiver, and the first processor is configured to process a signal outputted from the signal receiver. In an embodiment, the signal receiver may be the signal receiver described in above section.

An embodiment of the present invention also provides a signal output apparatus comprising a second transmission device, the signal receiver as described above, and a second processor that are sequentially connected, wherein the second processor is configured to transmit a signal to be outputted to the input end of the signal receiver, and the second transmission device is configured to transmit a signal outputted from the output end of the signal receiver.

An embodiment of the present invention also provides a signal transmission apparatus comprising a signal input apparatus, and a signal output apparatus that is coupled to the signal input apparatus. In one embodiment, the signal input apparatus can be the one described in the above sections and the signal output apparatus can be the one described in the above sections.

Thus, the present invention discloses an improved signal receiver having different bias circuits connected to the first stage of the signal receiver. By applying different bias voltages to different transistors in the inverter, the level range of the input signal and the level range of the output signal of the inverter are compensated, which improve the transmission performance of the I/O interface.

BRIEF DESCRIPTION OF THE DRAWINGS

The accompanying drawings are used to provide a further understanding of the features and advantages of the present invention and constitute a part of the application. The present invention will be described in the following exemplary embodiments with the accompanying drawings in which.

DETAILED DESCRIPTION OF THE INVENTION

The present invention will be described hereinafter in detail with reference to the drawings and preferred embodiments. It shall be understood that the embodiments of the present invention and the features of the embodiments can be combined with each other where applicable.

First Embodiment

Figure 3:
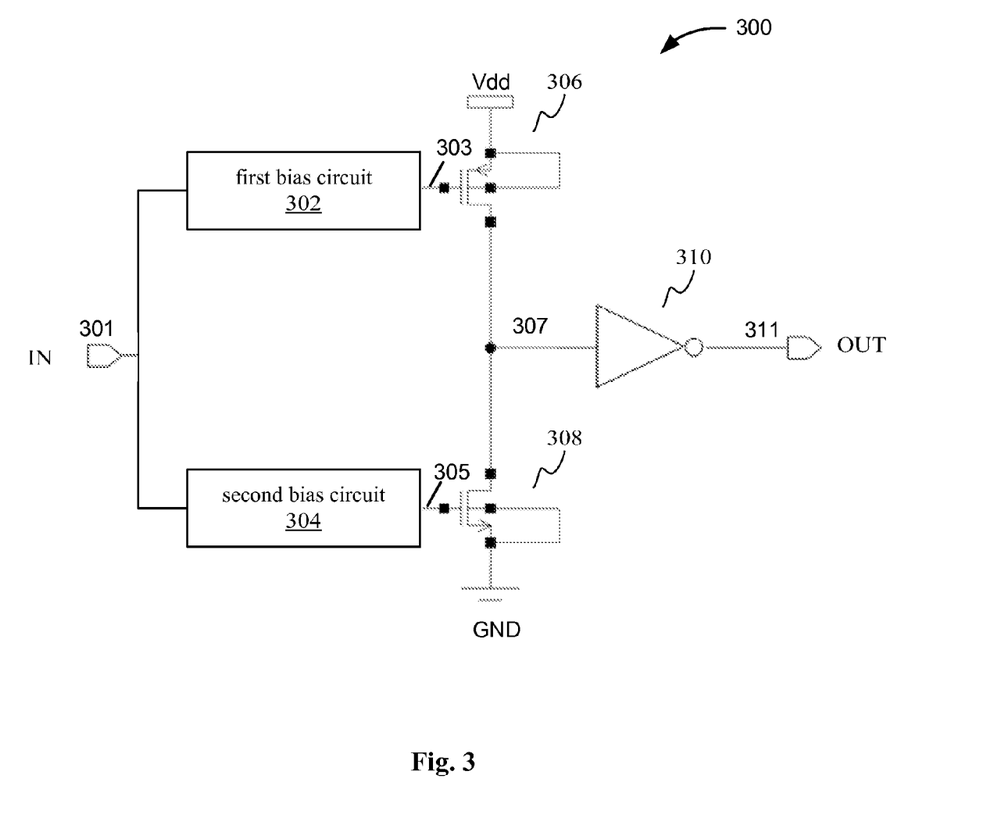
FIG. 3 is a preferred schematic diagram of a signal receiver according to an embodiment of the present invention.

FIG. 3 is a schematic diagram of a signal receiver 300 according to an embodiment of the present invention. As shown, signal receiver 300 comprises a first bias circuit 302, a second bias circuit 304, a first CMOS inverter, and a second inverter 310. First bias circuit 302 is coupled to an input terminal IN of the signal receiver 300 for receiving an input signal 301 and converting input signal 301 to a first bias signal 303. In an embodiment, the first bias signal 303 has a voltage amplitude that is smaller than a voltage amplitude of the input signal 301 of the signal receiver. In the following description, input and output nodes of a transistor are alternatively used as nodes as well as the corresponding input and output signals. For example, bias signal 303 at first bias circuit 302 can alternatively used as output or output node 303 of the first bias circuit 302.

Second bias circuit 304 is coupled to the input IN of the signal receiver for receiving the input signal 301 and for converting the input signal 301 to a second bias signal 305. In an embodiment, a voltage amplitude of the second bias signal 305 is greater than that of the input signal 301 of the signal receiver.

The first CMOS inverter includes a PMOS device 306 having a gate coupled to the first bias signal 303 and an NMOS device 308 having a gate coupled to the second bias signal 305. The source of the PMOS device is connected to power supply voltage Vdd and the source of the NMOS device is connected to a ground GND. The drains of the PMOS and NMOS devices are connected together at a node 307. The first CMOS inverter provides an output signal 307 in response to the first and second bias signals 303, 305, which in turn are responsive to input signal 301.

The second inverter 310 is coupled to output signal 307 of the first inverter and configured to output an output signal 311 at the output OUT.

When the input signal 301 is a high level VINH, first bias circuit 302 outputs first bias signal 303 VXH, and the second bias circuit 304 outputs second bias signal 305 VYH, wherein VYH>VINH>VXH. Under the effect of VXH and VYH, the NMOS device 308 is turned on, causing the first inverter to output a low logic level at output 307, and the second inverter 310 to output a high logic level.

In one embodiment, when the input signal 301 is a high level VINH, before the first bias circuit 302 and the second bias circuit 304 compensate the first inverter, the PMOS device 306 is turned off, and the NMOS device 308 is weakly turned on in such a manner that it cannot pull the level of the output node 307 to a low level in the high frequency period. After the first bias circuit 302 and the second bias circuit 304 compensate the first inverter, the NMOS device 308 is turned on, and the PMOS device 306 is turned off or weakly turned on (when the PMOS device 306 is weakly turned on, the PMOS device 306 is in a subordinate position, while the NMOS device 308 is in a dominant position, the PMOS device 306 will not affect the dominance of the NMOS device 308). In this way, when the VINH is not equal to the power supply voltage Vdd, the NMOS device 308 will be compensated and strengthened, and is still capable of pulling the level of the output node to a low level (i.e., causing the first inverter to output a low level) in the high frequency period, when the PMOS device 306 is turned off or weakly turned on, causing the second inverter 310 to output a high level.

When the input signal is a low level VINL, the first bias circuit 302 outputs first bias signal 303 VXL, and the second bias circuit 304 outputs second bias signal 305 VYL, wherein VYL>VINL>VXL. Under the effect of VXL and VYL, the PMOS device 306 is turned on, causing the first inverter to output a high level, and the second inverter 310 to output a low level.

In one embodiment, when the input signal is a low level VINL, before the first bias circuit 302 and the second bias circuit 304 compensate the first inverter, the NMOS device 308 is turned off, and the PMOS device 306 is weakly turned on in such a manner that it cannot pull the level of the output node 307 to a high level in the high frequency period. After the compensation of the first bias circuit 302 and the second bias circuit 304, the PMOS device 306 is turned on, and the NMOS device 308 is turned off or weakly turned on (when the NMOS device 308 is weakly turned on, the PMOS device 306 is in a dominant position, while the NMOS device 308 is in a subordinate position, the NMOS device 308 will not affect the dominance of the PMOS device 306). In this way, when the VINL is not equal to the ground voltage, the PMOS device 306 will be compensated and strengthened, and is still capable of pulling the level of the output node 307 to a high level (i.e., causing the first inverter to output a high level) in the high frequency period, when the NMOS device 308 is turned off or weakly turned on, causing the second inverter 310 to output a low level.

As can be seen from the above compensation principle, the second bias signal VYH which is obtained by means of the second bias circuit 304 and which makes the NMOS device 308 turned on is greater than the high level VINH of the input signal; and the first bias signal VXL which is obtained by means of the first bias circuit 302 and which makes the PMOS device 306 turned on is smaller than the low level VINL of the input signal. That is, the level range [VYH, VXL] obtained by means of the first bias circuit 302 and the second bias circuit 304 is greater than the level range [VINH, VINL] of the input signal. In this way, the level range of the input signal and the level range of the output signal of the inverter are compensated, which improve the transmission performance of the signal receiver. These features and advantages are not available with the conventional receivers shown in FIGS. 1 and 2.

In a preferred embodiment, the first bias circuit 302 comprises a first voltage division circuit connected between the input of the signal receiver and the ground.

Figure 4:
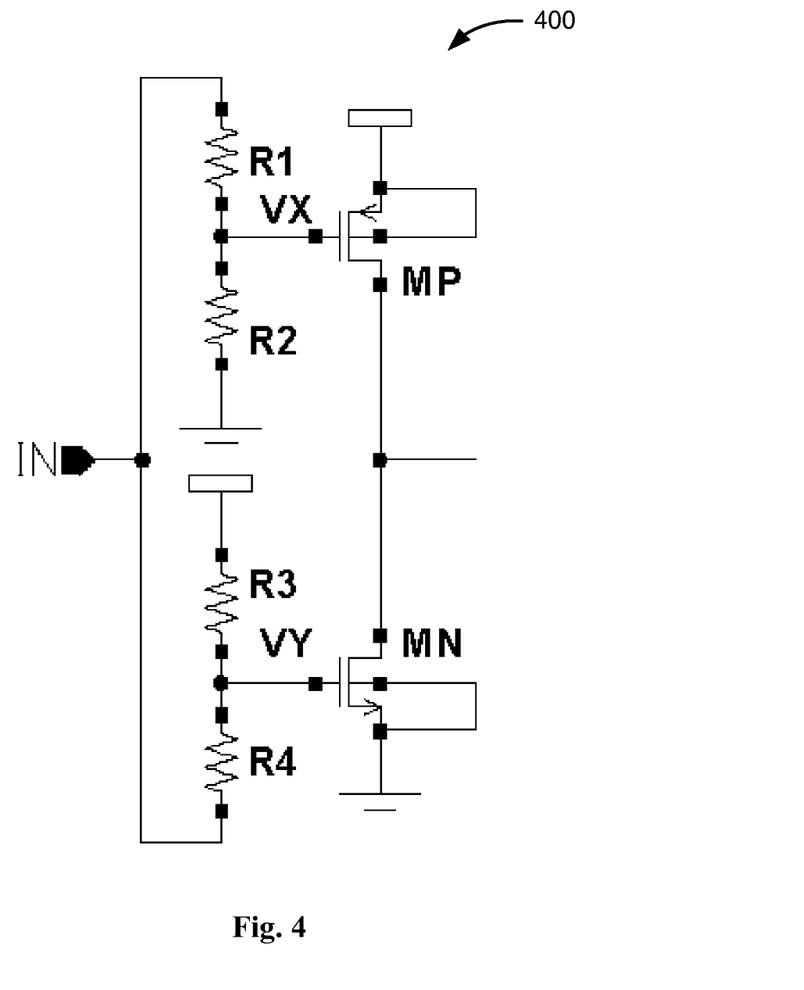
FIG. 4 is a preferred schematic diagram of a bias circuit according to an embodiment of the present invention.
Figure 5:
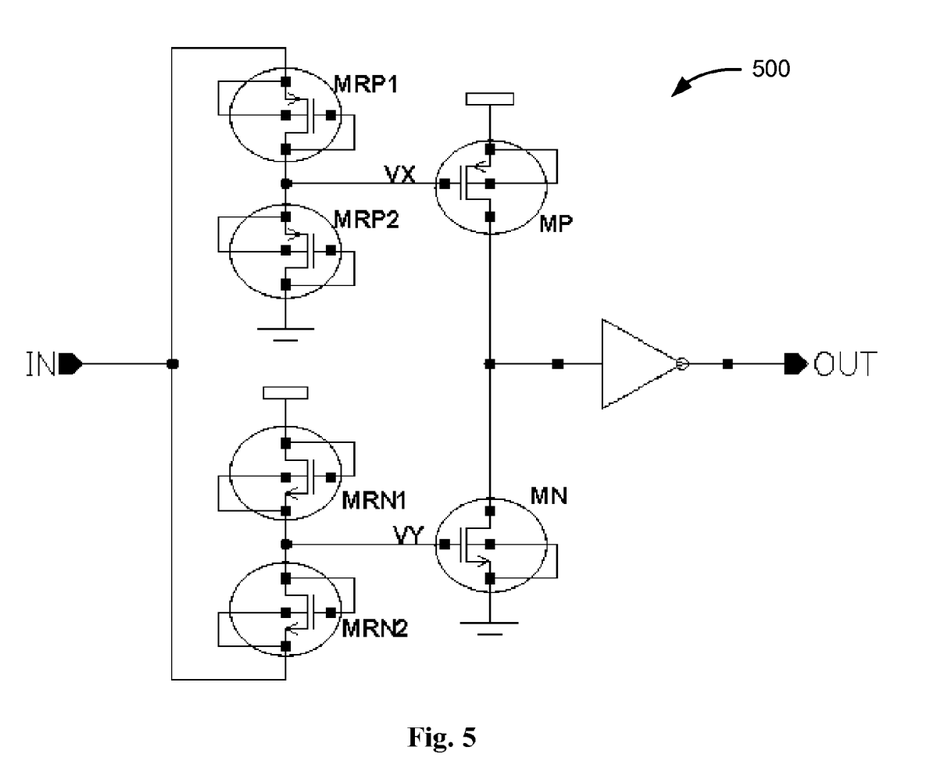
FIG. 5 is a preferred schematic diagram of a bias circuit according to another embodiment of the present invention.

FIG. 4 shows a schematic diagram of a bias circuit according to an embodiment of the present invention. FIG. 5 shows a schematic diagram of a bias circuit according to another embodiment of the present invention. Of course, the present invention is not limited to these two circuit implementations, any other circuits that can achieve the function of voltage division shall be understood as within the scope of the present invention.

In one embodiment, the first bias circuit can be a resistive voltage divider comprising a first resistor R1 and a second resistor R2 connected in series between the input IN of the signal receiver and the ground, wherein a node VX of the first resistor R1 connected with the second resistor R2 is the output of the first bias circuit, as shown in FIG. 4.

In another embodiment, the first bias circuit can be a voltage divider comprising a first transistor MRP1 and a second transistor MRP2 connected in series between the input IN of the signal receiver and the ground, wherein node VX of the first transistor MRP1 connected with the second transistor MRP2 is the output of the first bias circuit, as shown in FIG. 5. In one embodiment, the first transistor MRP1 can be one of a PMOS device or an NMOS device, and the second transistor MRP2 can be one of a PMOS device or an NMOS device. In a preferred embodiment, first transistor MRP1 has a source connected to the input signal, the gate and drain are connected together and with the source of second transistor MRP2. Second transistor MRP2 has its gate connected to the drain which is then tied to the ground.

In a preferred embodiment, the second bias circuit 304 comprises a second voltage division circuit connected between the input IN of the signal receiver and a predetermined power supply voltage, wherein the amplitude of the predetermined power supply voltage is greater than the voltage amplitude of the input signal IN of the signal receiver.

The present invention shows two types of circuitry for the implementation of the voltage division circuit, as shown in FIG. 4 and FIG. 5. Of course, the present invention is not limited to these two circuit types, any other types of circuitry that can achieve the function of voltage division can also be used and fall within the scope of the present invention.

In one embodiment, the second voltage division circuit can be a resistive voltage divider comprising a third resistor R3 and a fourth resistor R4 connected in series between the input IN of the signal receiver and the predetermined power supply voltage, wherein a node VY of the third resistor R3 connected with the fourth resistor R4 is the output of the second bias circuit.

In one embodiment, the second voltage division circuit can further be a voltage divider comprising a third transistor MRN1 and a fourth transistor MRN2 connected in series between the input IN of the signal receiver and the predetermined power supply voltage, wherein node VY of the third transistor MRN1 connected with the fourth transistor MRN2 is the output of the second bias circuit, as shown in FIG. 5.

In one embodiment, the third transistor MRN1 can be one of a PMOS device or an NMOS device, and the fourth transistor MRN2 can be one of a PMOS device or an NMOS device. In a preferred embodiment, third transistor MRN1 is an NMOS transistor having the drain and gate connected together and connected to the predetermined power supply voltage. Fourth transistor MRN2 is an NMOS transistor having its drain and gate connected together and connected to the source of the third transistor MRN1 and its source connected to input signal IN.

Figure 9:
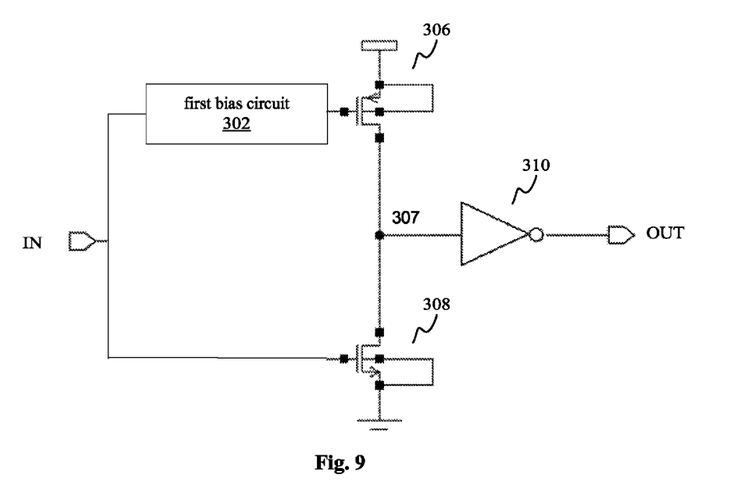
FIG. 9 is a preferred schematic diagram of the signal receiver according to an embodiment of the present invention.
Figure 10:
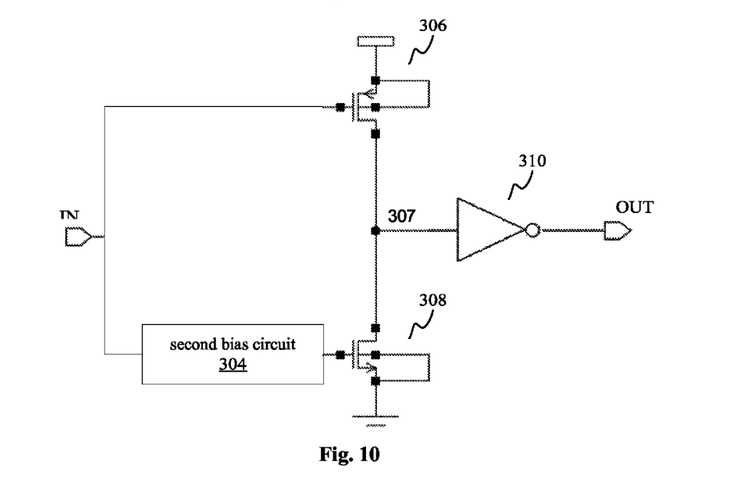
FIG. 10 is a preferred schematic diagram of the signal receiver according to an embodiment of the present invention.

In an alternative embodiment of the present invention, the signal receiver can include only one of the first bias circuit 302 and the second bias circuit 304. For example, when the signal receiver only includes the first bias circuit 302 and does not include the second bias circuit 304, the gate of NMOS device 308 of the first inverter is connected with the input IN of the signal receiver, as shown in FIG. 9. When the signal receiver only includes the second bias circuit 304, but does not include the first bias circuit 302, the gate of PMOS device 306 of the first inverter is connected with the input IN of the signal receiver, as shown in FIG. 10. In these example embodiments, the component parts and the connection relation thereof in the first bias circuit 302 and the second bias circuit 304, and the connection relation between the first bias circuit 302 and the second bias circuit 304 and other elements are as described above, and no further description is made herein for the sake of brevity.

Second Embodiment

Figure 6:
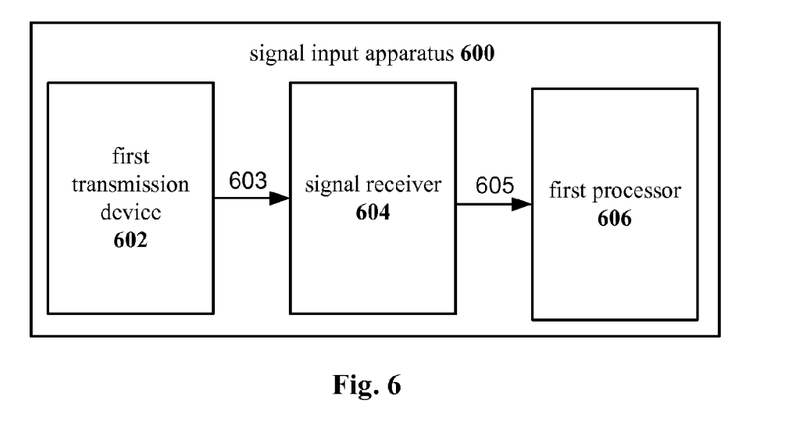
FIG. 6 is a preferred schematic diagram of a signal input apparatus according to an embodiment of the present invention.

FIG. 6 shows a schematic diagram of a signal input apparatus 600 according to an embodiment of the present invention. As shown in FIG. 6, signal input apparatus 600 includes a first transmission device 602, a signal receiver 604 coupled to first transmission device 602, and a first processor 606 coupled to signal receiver 604. That is, first transmission device 602, signal receiver 604, and first processor 606 are connected in series, wherein first transmission device 602 is configured to transmit a signal 603 to the signal receiver 604, and first processor 606 is configured to process a signal 605 outputted from signal receiver 604.

In one embodiment, signal receiver 604 can be one of the signal receivers shown in FIGS. 3, 4, 9, and 10 that have been described in detail in the first embodiment above, and their description won't be repeated herein for the sake of brevity. In addition, as to the first transmission device 602 and the first processor 606 in this example embodiment, the application gives no limitation on the circuit implementations and the operating principle thereof. An example of signal input apparatus 600 may be that first transmission device 602 has a voltage supply range or an output magnitude swing smaller than the power supply voltage of signal receiver 604. It is understood that first processor 606 can be any logic device or memory device such as dynamic or static random access memory, flash memory, and the like.

Third Embodiment

Figure 7:
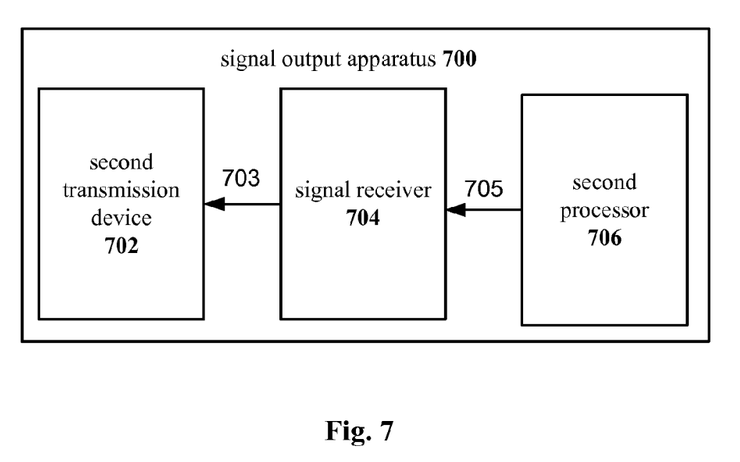
FIG. 7 is a preferred schematic diagram of a signal output apparatus according to an embodiment of the present invention.

FIG. 7 shows a schematic diagram of a third embodiment of a signal output apparatus 700 according to an embodiment of the present invention. As shown in FIG. 7, signal output apparatus 700 includes a second transmission device 702, a signal receiver 704, and a second processor 706 that are sequentially connected, wherein second processor 706 is configured to transmit a signal 705 to an input of the signal receiver 704, and second transmission device 702 is configured to transmit a signal 703 received from signal receiver 704. In other words, the system configuration shown in FIG. 7 is the configuration of FIG. 6 operating in reverse. In some embodiments, signal receiver 704 can be one of the signal receivers shown in FIGS. 3, 4, 9, and 10 that have been described in detail in the first embodiment above, and their description won't be repeated herein for the sake of brevity.

In addition, as to the second transmission device 702 and the second processor 706 in this third example embodiment, the application gives no limitation on the implementing method and the working process thereof.

Fourth Embodiment

Figure 8:
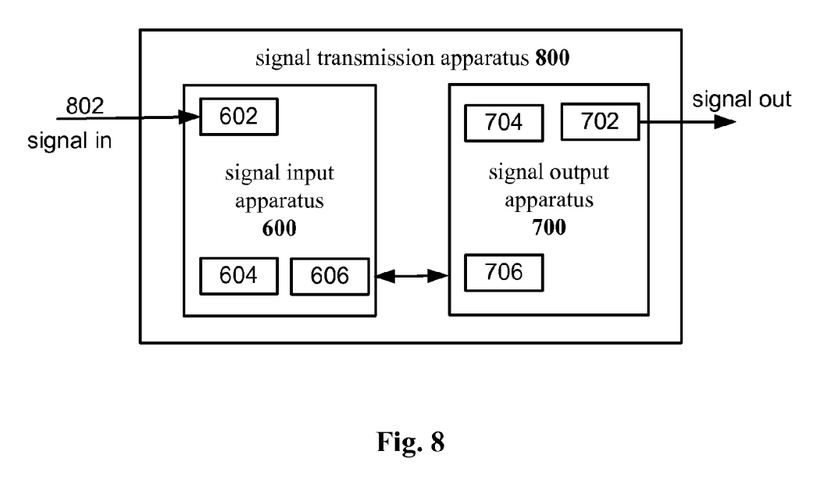
FIG. 8 is a preferred schematic diagram of a signal transmission apparatus according to an embodiment of the present invention.

FIG. 8 shows a schematic diagram of a signal transmission apparatus 800 of the present invention in that it can take advantage of the second embodiment and the third embodiment. In this example embodiment, the signal input apparatus 600 may include first transmission device 602, signal receiver 604, and first processor 606 as described in the second embodiment. Signal input apparatus 600 may receive a signal 802 having a smaller voltage amplitude swing than the power supply voltage of the input apparatus. Signal input apparatus 600 then converts the input signal 802 to voltage levels that are suitable for signal output apparatus 700. Signal output apparatus 700 may include second processor 706, signal receiver 704, and second transmission device 702 as described in the third embodiment above.

In one embodiment, the implementation circuit and the operations of the signal receiver 604 can be as shown in the first embodiment, which has been described in detail in above sections so that no description is made herein for the sake of brevity.

It should be understood that embodiments of the present invention described herein are provided by way of example only and that numerous substitutions, variations, and modifications can be made without departing from the spirit and scope of the invention. Thus, the breadth and scope of the present invention should not be limited by any of the above-described exemplary embodiments, but should be defined only in accordance with the following claims and their equivalents.

What is claimed is:

1. A signal receiver comprising:
   a first bias circuit having a first input terminal configured to receive an input signal and to convert the received input signal to a first bias signal, wherein a voltage amplitude of the first bias signal is different from a voltage amplitude of the input signal;
   a first inverter coupled to the first bias circuit, the first inverter comprising a PMOS device and an NMOS device, each of the PMOS and NMOS devices having a gate, a source, and a drain, the source of the PMOS device coupled to a power supply voltage, the source of the NMOS device coupled to a ground, the drains of the PMOS and NMOS devices being coupled together forming a first node, the gate of the PMOS and NMOS devices being coupled to either the input signal or to the first bias signal in response to the voltage amplitude of the first bias signal; and
   a second inverter coupled to the first node.

2. The signal receiver according to claim 1, wherein in the case that the voltage amplitude of the first bias signal is smaller than the voltage amplitude of the input signal, the gate of the PMOS device is coupled to the first bias signal, and the gate of the NMOS device is coupled to the input signal; and in the case that the voltage amplitude of the first bias signal is greater than the voltage amplitude of the input signal, the first bias signal is coupled to the gate of the NMOS, and the input signal is coupled to the gate of the PMOS device.

3. The signal receiver according to claim 1, further comprising:

a second bias circuit having a second input terminal configured to receive the input signal and to convert the input signal to a second bias signal, wherein a voltage amplitude of the second bias signal is different from the voltage amplitude of the input signal;

wherein in the case that the voltage amplitude of the first bias signal is smaller than the voltage amplitude of the input signal, the voltage amplitude of the second bias signal is greater than the voltage amplitude of the input signal, the gate of the PMOS device is coupled to the first bias signal, and the gate of the NMOS device is coupled to the second bias signal;

wherein in the case that the voltage amplitude of the first bias signal is greater than the voltage amplitude of the input signal, the voltage amplitude of the second bias signal is smaller than the voltage amplitude of the input signal, the gate of the NMOS device is coupled to the first bias signal, and the gate of the PMOS device is coupled to the second bias signal.

4. The signal receiver according to claim 1, wherein in the case that the voltage amplitude of the first bias signal is smaller than the voltage amplitude of the input signal, the first bias circuit comprises:
  a first voltage divider connected between the first input terminal and the ground; and
  in the case that the voltage amplitude of the first bias signal is greater than the voltage amplitude of the input signal, the first bias circuit comprises:
  a second voltage divider connected between the first input terminal and the power supply voltage, wherein an amplitude of the power supply voltage is greater than the voltage amplitude of the input signal.

5. The signal receiver according to claim 3, wherein in the case that the voltage amplitude of the second bias signal is smaller than the voltage amplitude of the input signal, the second bias circuit comprises:
  a first voltage divider connected between the second input terminal and the ground; and in the case that the voltage amplitude of the second bias signal is greater than the voltage amplitude of the input signal, the second bias circuit comprises:
  a second voltage divider connected between the second input terminal and the power supply voltage, wherein an amplitude of the power supply voltage is greater than the voltage amplitude of the input signal.

6. The signal receiver according to claim 4, wherein the first voltage divider comprises one of the following:

a first resistor and a second resistor connected in series forming a second node between the first input terminal and the ground, wherein the second node provides the first bias signal; or
  a first transistor and a second transistor connected in series forming a third node between the first input terminal and the ground, wherein the third node provides the first bias signal.

7. The signal receiver according to claim 4, wherein the second voltage division circuit comprises one of the following:
  a third resistor and a fourth resistor connected in series forming a fourth node between the first input terminal and the power supply voltage, wherein the fourth node provides the second bias signal; or
  a third transistor and a fourth transistor connected in series forming a fifth node between the first input terminal and the predetermined power voltage, wherein the fifth node provides the second bias signal.

8. The signal receiver according to claim 5, wherein the first voltage divider comprises:
  a fifth resistor and a sixth resistor connected in series between the first input terminal and the ground, wherein an end of the fifth resistor, connected with the sixth resistor, forms a fifth node providing the first bias signal or the second bias signal; or
  a fifth transistor and a sixth transistor connected in series between the first input terminal and the ground, wherein an end of the fifth transistor, connected with the sixth transistor, forms a sixth node providing the first bias signal or the second bias signal.

9. The signal receiver according to claim 5, wherein the second voltage divider comprises one of the following:
  a seventh resistor and an eight resistor connected in series between the second input terminal and the power supply voltage, wherein an end of the seventh resistor, connected with the eight resistor, forms a seventh node providing the second bias signal or the first bias signal; or
  a seventh transistor and an eighth transistor connected in series between the second input terminal and the power supply voltage, wherein an end of the seventh transistor, connected with the eight transistor, forms an eighth node providing the second bias signal or the first bias signal.

* * * * *